(12) United States Patent
Correll

(10) Patent No.: US 8,374,016 B2
(45) Date of Patent: Feb. 12, 2013

(54) METHOD FOR LEAKAGE REDUCTION IN MEMORY CIRCUITS

(75) Inventor: Jeffrey A. Correll, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 13/069,853

(22) Filed: Mar. 23, 2011

(65) Prior Publication Data
US 2012/0243288 A1 Sep. 27, 2012

(51) Int. Cl.
*G11C 17/00* (2006.01)

(52) U.S. Cl. ............ 365/96; 365/94; 365/103; 365/104; 365/187; 365/189.16

(58) Field of Classification Search .............. 365/94, 365/96, 103, 104, 187, 189.011, 189.16
See application file for complete search history.

(56) References Cited

U.S. PATENT DOCUMENTS

| | | | |
|---|---|---|---|
| 5,532,956 A | * | 7/1996 | Watanabe ..................... 365/149 |
| 5,581,502 A | | 12/1996 | Richart et al. |
| 5,732,014 A | * | 3/1998 | Forbes ........................ 365/149 |
| 7,085,184 B1 | * | 8/2006 | Walther et al. ................ 365/203 |
| 7,561,465 B2 | | 7/2009 | Hancock et al. |

OTHER PUBLICATIONS

Wikipedia, "Programmable Read-Only Memory," http://en.wikipedia.org/wiki/Programmable_read-only?memory, downloaded Dec. 10, 2010, 3 pages.

* cited by examiner

*Primary Examiner* — VanThu Nguyen
(74) *Attorney, Agent, or Firm* — Zagorin O'Brien Graham LLP

(57) ABSTRACT

An apparatus includes a bit cell of a programmable memory circuit. The bit cell includes a programmable device. The bit cell includes a first device having a first type. The first device is configured to conduct a first current between a first node and a second node in response to a first value of a signal on the word line and a signal on a bit line. The programmable device is configured to be programmed in response to a first level of the first current. The bit cell includes a circuit coupled to the second node. The circuit is configured to reduce a leakage current through the first device in response to a second value of the signal on the word line and based on a feedback signal. In at least one embodiment of the apparatus, the feedback signal is based on a signal on the bit line.

25 Claims, 4 Drawing Sheets

METHOD FOR LEAKAGE REDUCTION IN MEMORY CIRCUITS

BACKGROUND

1. Field of the Invention

This application is related to integrated circuits and more particularly to integrated circuit memory arrays.

2. Description of the Related Art

In general, a read-only memory (ROM) is a static memory structure that retains a state indefinitely, even without power. Read-only memory is typically arranged in an array having one bit cell per stored data bit. Signal lines connecting each row are known as word lines. An individual bit cell is coupled to at least some other bit cells (e.g., every bit cell) in the same column of the array. In a typical ROM, the array structure is implemented as a NOR array. The array structure may include any suitable NOR gate structure using one or more devices per bit cell (e.g., NMOS, pseudo-NMOS, domino NOR gate, etc.). The ROM may be programmed during device manufacturing or after device manufacturing.

A programmable read-only memory (PROM) (i.e., field programmable read-only memory (FPROM) or one-time programmable non-volatile memory (OTP NVM)) is a form of digital memory that is programmed after a device is constructed. In a typical PROM, a one-time programmable element is used to set the state of an individual bit cell. For example, the state of each bit cell may be locked or permanently stored by a fuse or an antifuse. Blowing a fuse opens a connection or increases the resistance of the fuse element by a substantially detectable amount, and programming an antifuse closes a connection or decreases the resistance of the antifuse element by a substantially detectable amount. A typical PROM is manufactured with all bit cells reading as a particular value (e.g., '0' or '1'). If the PROM is manufactured with all bit cells reading as '1,' blowing a fuse of a bit cell during programming will cause the bit cell to read as '0.' A typical PROM can be programmed just once after manufacturing by blowing appropriate fuses, which is an irreversible process. In general, since it is impossible to reverse the programming (e.g., blowing) of a fuse, the only possible changes to the PROM after programming include changing the state of any bit cells that remain at '1' to '0' by blowing those remaining fuses. After all of the bit cells have blown fuses (e.g., read '0'), no further programming changes are possible.

SUMMARY OF EMBODIMENTS OF THE INVENTION

In at least one embodiment of the invention, an apparatus includes a bit cell of a programmable memory circuit. The bit cell includes a programmable device. The bit cell includes a first device having a first type. The first device is configured to conduct a first current between a first node and a second node in response to a first value of a signal on a word line and a signal on a bit line. The programmable device is configured to be programmed in response to a first level of the first current. The bit cell includes a circuit coupled to the second node. The circuit is configured to reduce a leakage current through the first device in response to a second value of the signal on the word line and based on a feedback signal. In at least one embodiment of the apparatus, the feedback signal is based on a signal on the bit line. In at least one embodiment of the apparatus, the programmable device is a one-time programmable device.

In at least one embodiment of the invention, a method comprises reducing a leakage current through a first device of a first type in a bit cell of a programmable memory circuit. The reducing is in response to a first signal on a word line of the bit cell and based on a feedback signal that is representative of a signal on a bit line coupled to the bit cell. In at least one embodiment of the method, the reducing comprises establishing a voltage on a first terminal of the first device in response to the first signal on the word line of the bit cell. The established voltage is substantially the same as a voltage on a second terminal of the first device. In at least one embodiment of the method, the establishing includes generating the feedback signal based on a voltage sensed on a bit line coupled to the bit cell. In at least one embodiment of the method, the programmable device is a one-time programmable device.

In at least one embodiment of the invention, a tangible computer-readable medium encoding includes a representation of an integrated circuit that comprises a bit cell of a programmable memory circuit. The bit cell includes a programmable device. The bit cell includes a first device having a first type. The first device is configured to conduct a first current between a first node and a second node in response to a first value of a signal on a word line and a signal on a bit line. The programmable device is configured to be programmed in response to a first level of the first current. The bit cell includes a circuit coupled to the second node. The circuit is configured to reduce a leakage current through the first device in response to a second value of the signal on the word line and based on a feedback signal. In at least one embodiment of the apparatus, the feedback signal is based on the signal on the bit line. In at least one embodiment of the tangible computer-readable medium encoding, the programmable device is a one-time programmable device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
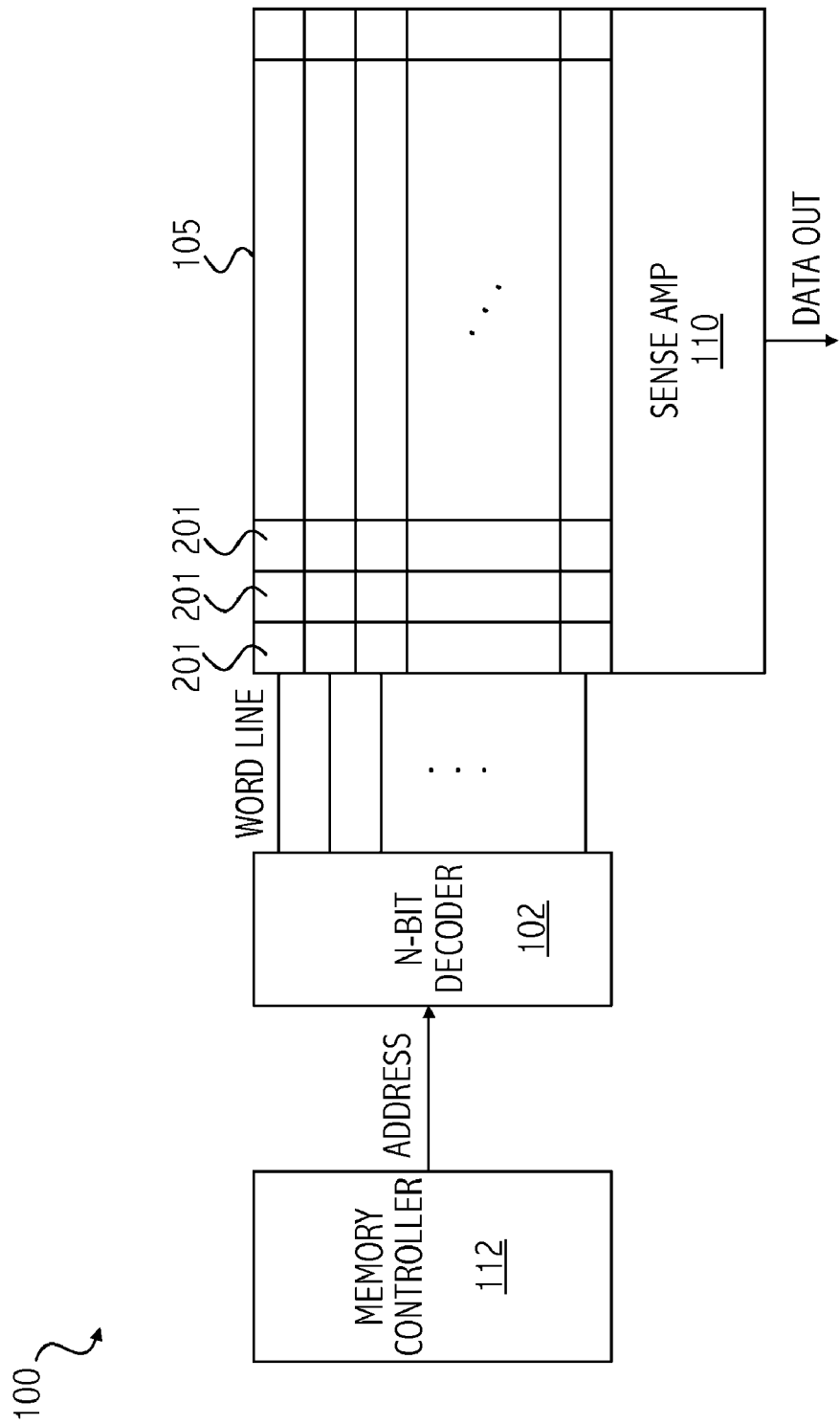
FIG. 1 illustrates a functional block diagram of an exemplary memory system including an array of bit cells including programmable devices.

Referring to FIG. 1, an exemplary memory system (e.g., memory system 100) includes a memory array of bit cells (e.g., memory array 105 including bit cells 201). In at least one embodiment, memory system 100 includes a memory controller (e.g., memory controller 112) that provides an address of a particular location (e.g., a location corresponding to one or more bit cells) in memory to be accessed (i.e., read or written). A decoder (e.g., n-bit decoder 102) decodes the address and provides a corresponding word line select signal to memory array 105. In a typical read operation, decoder 102 asserts a word line to select one row of memory array 105 for reading based on the address received from memory controller 112. Sense amplifiers (e.g., sense amplifiers or comparators 110) detect a change in voltage level that results when a particular bit cell is switched onto the bit line. Then, sense amplifiers 110 provide an indicator of that voltage level on a data out line. In at least one embodiment of memory system 100, sense amplifiers 110 are differential sense amplifiers or other suitable sensing circuits.

Figure 2:
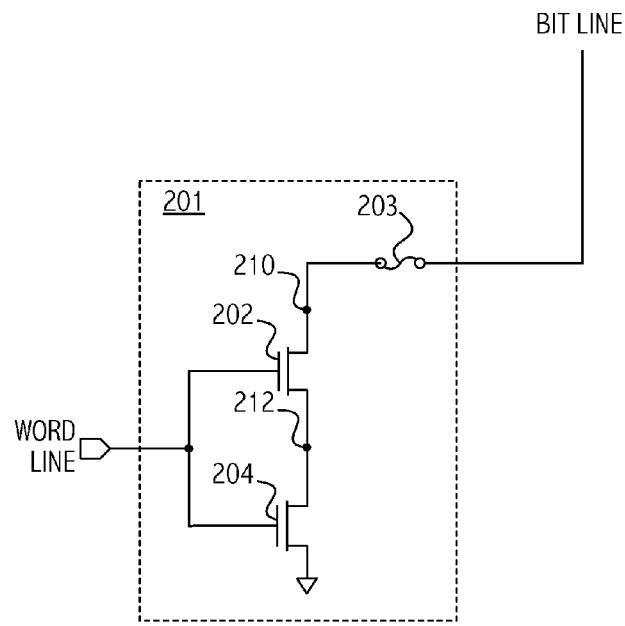
FIG. 2 illustrates a circuit diagram of an exemplary bit cell of the memory system of FIG. 1.

Referring to FIG. 2, in at least one embodiment of memory array 105, an individual bit cell (e.g., bit cell 201) includes a one-time programmable element (e.g., fuse 203) coupled to at least one switch device (e.g., n-type device 202 and n-type device 204) for providing a path to a power supply voltage node (e.g., ground). In at least one embodiment, fuse 203 is a silicide agglomeration fuse device. However, any suitable fuse, antifuse, or other one-time programmable device may be used within bit cell 201. In at least one embodiment, bit cell 201 is programmed by applying a high-voltage pulse (i.e., a pulse having voltage level that is greater than voltage levels encountered during typical read operations of the memory) to the bit-line. The high-voltage pulse and associated current required to program a fuse necessitates large devices that can withstand those voltages and/or currents and provide a current path through the fuse to a power supply node. In at least one embodiment of a memory array, turning on the devices in one and only one of those bit cells in a column of the array using a corresponding word line provides the current path for programming or sensing. In other memory array embodiments, devices in more than one bit cell may be turned on, allowing programming and/or sensing of multiple bit cells at a time.

Figure 3:
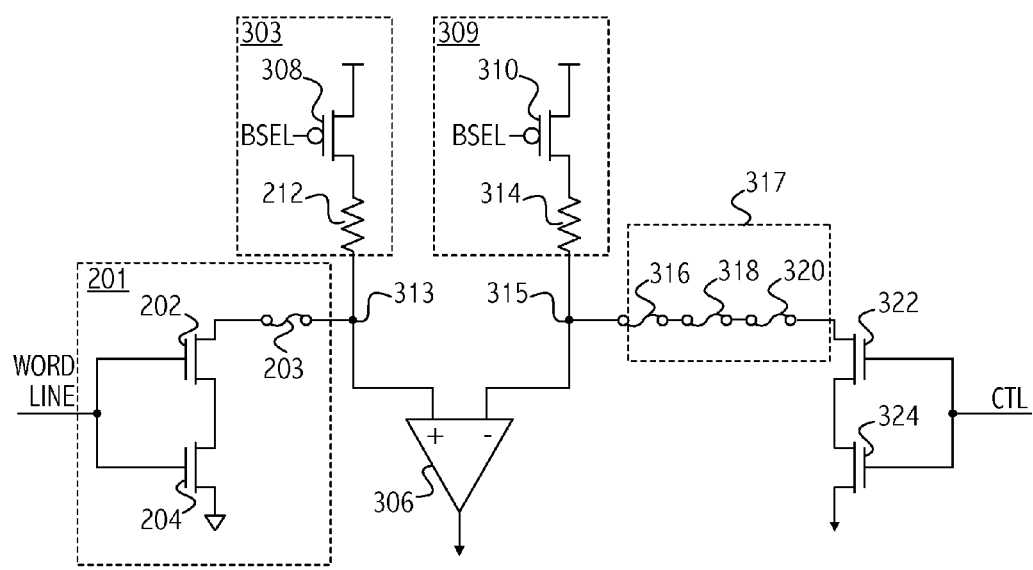
FIG. 3 illustrates a circuit diagram of an exemplary bit cell and sensing circuitry of the memory system of FIG. 1.

Referring to FIG. 3, once the memory is programmed to read bit cell 201, the associated word line has a value that enables devices 202 and 204 (e.g., high values) and the CTL and BSEL signals have values that enable the sensing operation. The voltage at a node (e.g., node 313) between a pull-up portion of the memory circuit (e.g., pull-up circuit 303) and the selected one-time programmable device is compared to a voltage on a reference node (e.g., reference node 315) coupled between another pull-up circuit portion (e.g., pull-up circuit 309) and a reference resistance (e.g., reference 317, which may include one or more unprogrammed one-time programmable devices identical to the one-time programmable device in bit cell 201). In at least one embodiment, pull-up circuit 309 is substantially identical to pull-up circuit 303. If the voltage level sensed on node 313 is greater than the voltage on node 315, then sense amplifier 306 outputs a signal indicating that fuse 203 is programmed. If the voltage level sensed on node 313 is less than the voltage on node 315, then sense amplifier 306 outputs a signal indicating that fuse 203 is unprogrammed.

Since a substantial current is required to program fuse 203, devices 202 and 204 are sized accordingly (e.g., devices 202 and 204 are large devices). However, devices manufactured using deep sub-micron transistor manufacturing technologies exhibit large drain-to-source leakage currents. When a substantial number of fuse elements is connected to a common bit line, bit cells associated with disabled word lines generate a proportionately large leakage current, which reduces the voltage level sensed on node 313 for bit cells associated with enabled word lines, thereby introducing error into the sensing operation. For example, if the leakage current is great enough, a programmed fuse may be sensed as an unprogrammed fuse.

Figure 4:
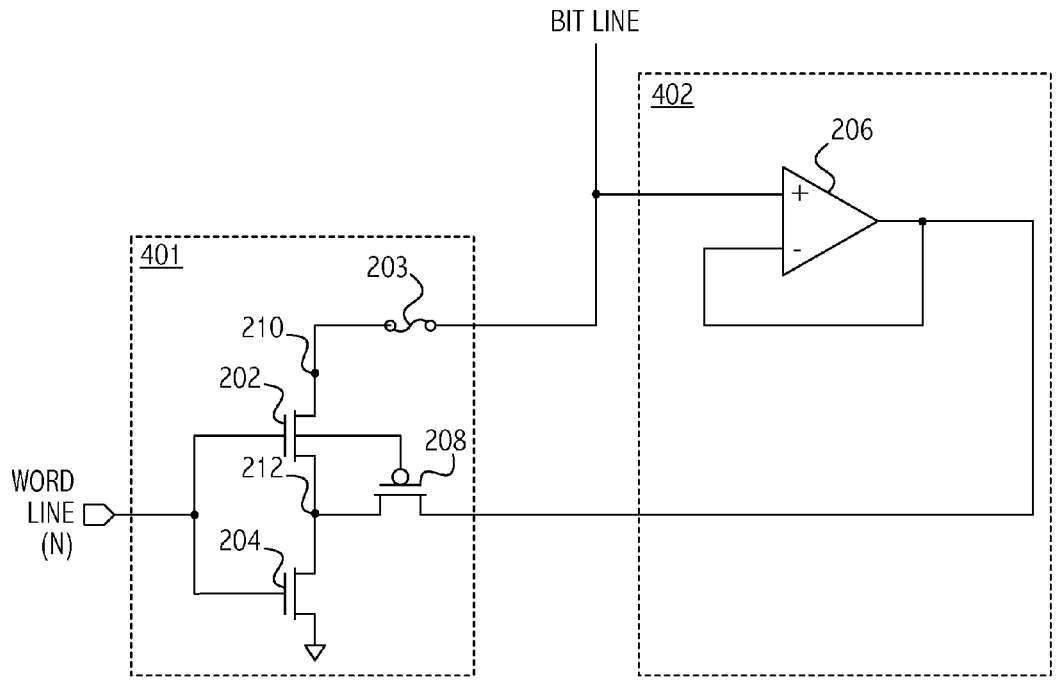
FIG. 4 illustrates a circuit diagram of an exemplary bit cell consistent with at least one embodiment of the invention.

Techniques to reduce or eliminate those leakage currents and/or effects of those leakage currents include increasing the length of affected devices, applying voltages to the body nodes of the devices, or changing the manufacturing process to improve the leakage current. A technique for reducing or eliminating the leakage current includes reducing or eliminating the drain-to-source voltage ($V_{DS}$) of those devices when the associated word line is not selected. The reduction or elimination of the leakage current increases a window of operation of the memory system over process, voltage, and temperature conditions. Referring to FIG. 4, in at least one embodiment of memory system 100, a reduced leakage bit cell (e.g., bit cell 401) is responsive to a feedback signal generated by a feedback circuit (e.g., feedback circuit 402). Bit cell 401 lowers the drain-to-source voltage ($V_{DS}$) of device 202 (e.g., to approximately 0 Volts), thereby reducing the leakage current through device 202 to a level that is inconsequential to the sensing operation (e.g., approximately 0 Amperes).

In at least one embodiment, bit cell 401 includes a p-type device (e.g., device 208) that when enabled, provides to node 212 a signal based on the feedback signal generated by feedback circuit 402. In at least one embodiment of bit cell 401, device 208 is a small device (e.g., a minimum length device). In at least one embodiment of bit cell 401, device 208 has a size suitable to provide a current that has the same magnitude as a leakage current that would otherwise flow through device 202 when the associated bit cell is not selected, thereby increasing the voltage on the source node (e.g., node 212) of device 202 and reducing the $V_{DS}$ of device 202. In at least one embodiment of bit cell 401, device 208 has a length longer than a typical device in the target manufacturing process to reduce or eliminate leakage in device 208. Note that in other embodiments of memory system 100, device 208 may be replaced with other circuit structures that pass a signal based on the feedback signal to node 212.

In at least one embodiment, feedback circuit 402 includes a unity gain amplifier (e.g., amplifier 206). In at least one embodiment, amplifier 206 has a voltage-follower configuration and provides an output signal that has a voltage level that is approximately the same as the voltage level on the bit line. In at least one embodiment of feedback circuit 402, a multiplexer circuit is included instead of amplifier 206. Note that circuit 402 may include other suitable circuits that replicate the bit line voltage.

Figure 5:
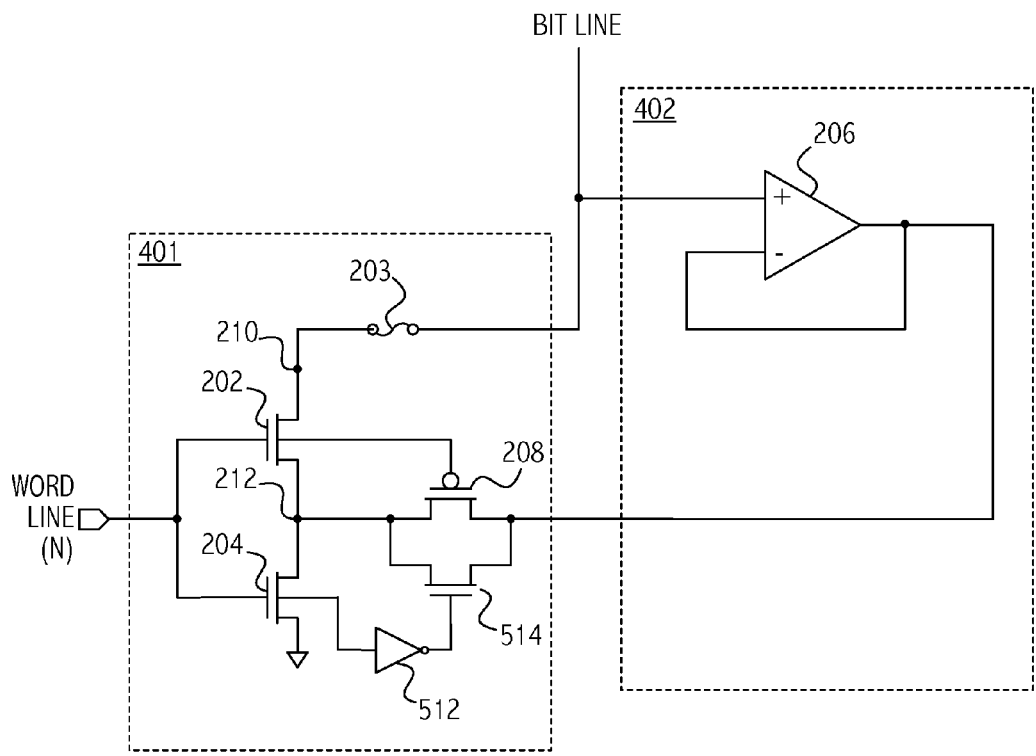
FIG. 5 illustrates a circuit diagram of an exemplary bit cell consistent with at least one embodiment of the invention.
Figure 6:
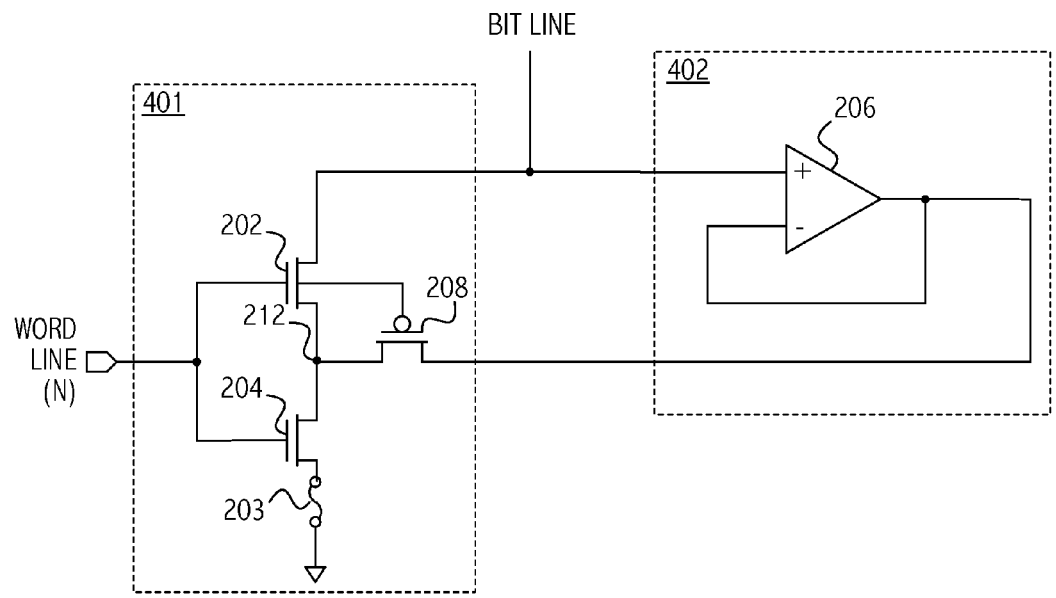
FIG. 6 illustrates a circuit diagram of an exemplary bit cell consistent with at least one embodiment of the invention.
Figure 7:
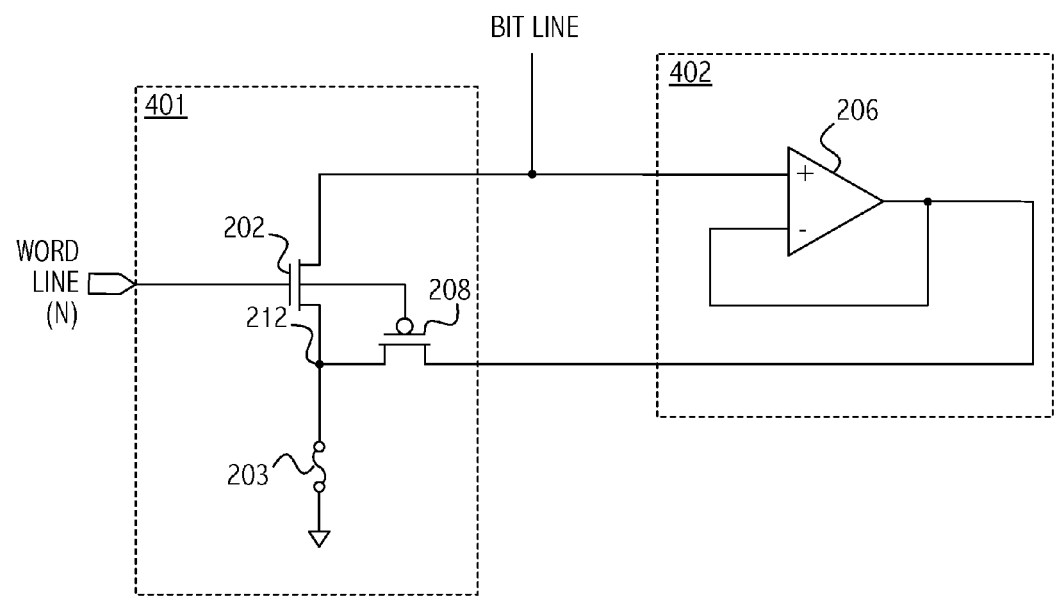
FIG. 7 illustrates a circuit diagram of an exemplary bit cell consistent with at least one embodiment of the invention.

Referring to FIG. 5, in at least one embodiment of memory array 105, bit cell 401 includes an additional device (e.g., device 514) to form a full transmission gate. In at least one embodiment of bit cell 401, rather than compensating in voltage mode, current mode compensation is used. For example, devices 208 and 514 are replaced with a current source responsive to the feedback signal to provide a current to node 212. That current reduces or eliminates a voltage drop on node 212. In at least one embodiment of bit cell 201, additional devices of the same size as device 204 and/or additional devices of different sizes are used. For example, in at least one embodiment of bit cell 201, additional n-type, pull-down devices are coupled in series with device 204. Referring to FIG. 6, in at least one embodiment of bit cell 401, fuse 203 may be coupled between device 204 and a ground node. Referring to FIG. 7, in at least one embodiment of bit cell 401, device 204 is not included.

Referring to FIGS. 4-7, in at least one embodiment of memory system 100, during a sensing operation, one and only one of the word lines coupled to a memory array including bit cell 100 (e.g., WORD LINE (N)) is driven high. The high word line enables device 202, and device 204, if present, and provides a current path through fuse 203 to a ground node. Meanwhile, device 208, and device 514, if present, are turned off. All other word lines of the memory array are driven to an inactive state, e.g., a ground voltage level. When a word line is driven low (e.g., driven to a ground voltage level) to disable the sensing or programming operations, device 208, and device 514, if present, are turned on and provide to node 212 a voltage level approximately equal to the voltage level output by amplifier 206 to node 212. That is, a voltage level that is approximately equal to the voltage level on the bit line is provided to node 212 and the voltages on the drain and the source nodes of device 202 are substantially the same voltage level, thereby reducing or eliminating a leakage current through device 202. In at least one embodiment of memory system 100, this reduction in leakage current increases the performance of memory system 100 over process, voltage, and temperature conditions.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., HDL, Verilog, GDSII data) of such circuits, systems, and methods, all as described herein, and as defined in the appended claims. In addition, the computer readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which n-type devices are used in a bit cell, one of skill in the art will appreciate that the teachings herein can be utilized with p-type, pull-up devices in the bit cell. In addition, although techniques described herein are described with reference to a PROM, the techniques described herein are applicable to reducing or eliminating leakage currents in other circuit structures (e.g., ROMs, register files, general wired-NOR structures, etc.). Variations and modifications of the embodiments disclosed herein, may be made based on the description set forth herein, without departing from the scope and spirit of the invention as set forth in the following claims.

What is claimed is:

1. An apparatus comprising:
   a bit cell of a programmable memory circuit comprising:
      a programmable device;
      a first device having a first type, the first device being configured to conduct a first current between a first node and a second node in response to a first value of a signal on a word line and a signal on a bit line, the programmable device being configured to be programmed in response to a first level of the first current; and
      a circuit coupled to the second node and configured to reduce a leakage current through the first device in response to a second value of the signal on the word line and based on a feedback signal.

2. The apparatus, as recited in claim 1, wherein the feedback signal is based on the signal on the bit line.

3. The apparatus, as recited in claim 1, wherein the bit cell further comprises:
   a second device having the first type, the second device being coupled to the second node and the word line, the second device being operative to conduct the first current in response to the first value of the signal on the word line.

4. The apparatus, as recited in claim 3, wherein the programmable device is coupled between the first device and the bit line.

5. The apparatus, as recited in claim 3, wherein a gate terminal of the first device is coupled to the gate terminal of the second device, a drain terminal of the first device is coupled to the first node, and a drain terminal of the second device is coupled to a source terminal of the first device.

6. The apparatus, as recited in claim 1, wherein the circuit comprises:
   a third device of a second type, a first terminal of the third device being coupled to the word line, a second terminal of the third device being coupled to the second node, and a third terminal of the third device being configured to receive the feedback signal.

7. The apparatus, as recited in claim 6, wherein the third device is substantially smaller than the first device.

8. The apparatus, as recited in claim 7, wherein the third device has a size sufficient to provide a current substantially the same as the leakage current.

9. The apparatus, as recited in claim 6, wherein the circuit further comprises a fourth device of the first type coupled in parallel to the third device and operative in response to the second value of the signal on the word line.

10. The apparatus, as recited in claim 1, wherein the programmable device is coupled between the first device and a power supply node.

11. The apparatus, as recited in claim 1, further comprising:
   a unity gain amplifier circuit operative to generate the feedback signal, the unity gain amplifier circuit having an output terminal coupled to the circuit, a non-inverting input terminal coupled to the bit line, and an inverting terminal coupled to the output terminal.

12. The apparatus, as recited in claim 1, further comprising;
   a sensing circuit configured to sense a state of the programmable device using a second level of the first current, the second level of the first current being substantially less than the first level of the first current.

13. The apparatus, as recited in claim 1, wherein the programmable device comprises a one-time programmable device.

14. The apparatus, as recited in claim 1, wherein the programmable device comprises at least a fuse or an anti-fuse.

15. A method comprising:
   reducing a leakage current through a first device of a first type in a bit cell of a programmable memory circuit in response to a first signal on a word line of the bit cell and based on a feedback signal that is representative of a signal on a bit line coupled to the bit cell.

16. The method, as recited in claim 15, wherein the reducing comprises:
   establishing a voltage on a first terminal of the first device in response to the first signal on the word line of the bit cell, the established voltage being substantially the same as a voltage on a second terminal of the first device.

17. The method, as recited in claim 16, wherein the establishing includes generating the feedback signal based on a voltage sensed on a bit line coupled to the bit cell.

18. The method, as recited in claim 16, wherein the voltage is established by at least one device having a size substantially smaller than a size of the first device, the size of the at least one device being sufficient to provide a current substantially the same as a leakage current of the first device.

19. The method, as recited in claim 16, further comprising:
sensing a state of a programmable device of the programmable memory circuit in response to a first level of a signal on the bit line.

20. The method, as recited in claim 19, further comprising:
programming the programmable device in response to a second level of the signal on the bit line.

21. The method, as recited in claim 16, wherein a programmable device of the programmable memory circuit comprises a one-time programmable device.

22. A tangible computer-readable medium encoding a representation of an integrated circuit that comprises:
a bit cell of a programmable memory circuit comprising:
a programmable device;
a first device having a first type, the first device being configured to conduct a first current between a first node and a second node in response to a first value of a signal on a word line and a signal on a bit line, the programmable device being configured to be programmed in response to a first level of the first current; and
a circuit coupled to the second node and configured to reduce a leakage current through the first device in response to a second value of the signal on the word line and based on a feedback signal.

23. The tangible computer-readable medium encoding a representation of an integrated circuit, as recited in claim 22, wherein the feedback signal is based on the signal on the bit line.

24. The tangible computer-readable medium encoding a representation of an integrated circuit, as recited in claim 22, wherein the bit cell further comprises:
a second device having the first type, the second device being coupled to the second node and the word line, the second device being operative to conduct the first current in response to the first value of the signal on the word line.

25. The tangible computer-readable medium encoding a representation of an integrated circuit, as recited in claim 22, wherein the circuit comprises:
a third device of a second type, a first terminal of the third device being coupled to the word line, a second terminal of the third device being coupled to the second node, and a third terminal of the third device being configured to receive a voltage based on a voltage on the first node; and
a unity gain amplifier circuit having an output terminal coupled to the third device, a non-inverting input terminal coupled to the bit line, and an inverting terminal coupled to the output terminal.

\* \* \* \* \*